United States Patent [19]

McLaury

[11] Patent Number: 5,500,817
[45] Date of Patent: Mar. 19, 1996

[54] TRUE TRISTATE OUTPUT BUFFER AND A METHOD FOR DRIVING A POTENTIAL OF AN OUTPUT PAD TO THREE DISTINCT CONDITIONS

[75] Inventor: Loren L. McLaury, Boise, Id.

[73] Assignee: Micron Technology, Inc., Boise, Id.

[21] Appl. No.: 7,291

[22] Filed: Jan. 21, 1993

[51] Int. Cl.⁶ .................................................. G11C 7/00
[52] U.S. Cl. ........................... 365/189.05; 365/189.08; 365/189.09; 365/189.11; 365/227; 326/27; 326/57
[58] Field of Search .................... 365/189.05, 189.08, 365/189.11, 227, 189.09; 307/443, 473, 475, 451; 326/26–27, 57–58, 83

[56] References Cited

U.S. PATENT DOCUMENTS

| | | | |
|---|---|---|---|
| 4,498,022 | 2/1985 | Koyama et al. | 307/473 |
| 4,880,997 | 11/1989 | Steele | 307/443 |
| 4,893,276 | 1/1990 | Okuyama | 365/189.08 |
| 4,906,867 | 3/1990 | Petty | 307/443 |
| 4,953,130 | 8/1990 | Houston | 365/203 |
| 4,956,681 | 9/1990 | Yokoyama et al. | 257/22 |
| 4,988,888 | 1/1991 | Hirose et al. | 326/27 |
| 5,001,369 | 3/1991 | Lee | 307/473 |
| 5,057,711 | 10/1991 | Lee et al. | 326/27 |
| 5,151,621 | 9/1992 | Goto | 326/86 |
| 5,179,300 | 1/1993 | Rolandi et al. | 326/83 |
| 5,306,965 | 4/1994 | Asprey | 307/448 |
| 5,311,076 | 5/1994 | Park et al. | 307/443 |

OTHER PUBLICATIONS

1992 DRAM Data Book, Micron Semiconductor, Inc., pp. 5-111 through 5-154.

*Primary Examiner*—David C. Nelms
*Assistant Examiner*—Andrew Q. Tran
*Attorney, Agent, or Firm*—Susan B. Collier

[57] ABSTRACT

The invention is a circuit and method for providing a true tristate output at an output pad of a serial access memory device. The invention drives three distinct potentials to the output pad, two of which are potentials having high and low logic levels. The third potential, also referred to as the midrange potential, is a potential within a range of potentials defined by the potentials having the high and low logic levels. In an ideal case this potential is a midpoint potential midway between the potentials of the high and low logic level. The potential at the output pad is sensed by a sense circuit. The sense circuit creates a sense signal. Logic circuitry enabled by a one shot generator responds to the sense signal and disables the NOR function of an enable NOR gate and drives the output of the enable NOR gate to a potential that activates an output buffer. The output buffer drives the output pad to the desired midrange potential.

16 Claims, 14 Drawing Sheets

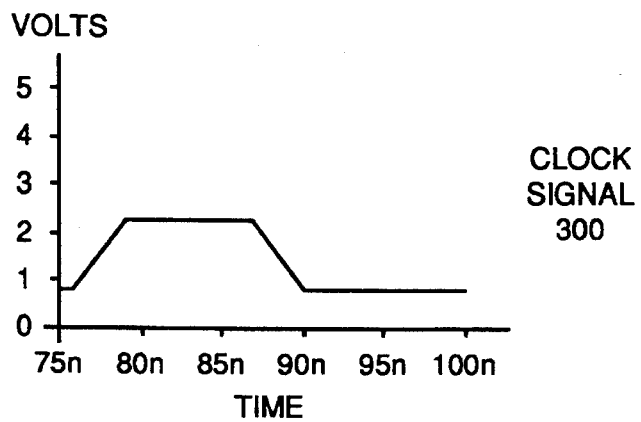
FIG. 8A — CLOCK SIGNAL 300
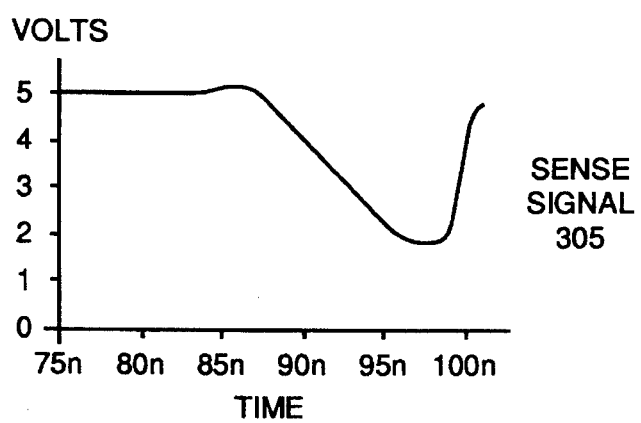
FIG. 8B — SENSE SIGNAL 305
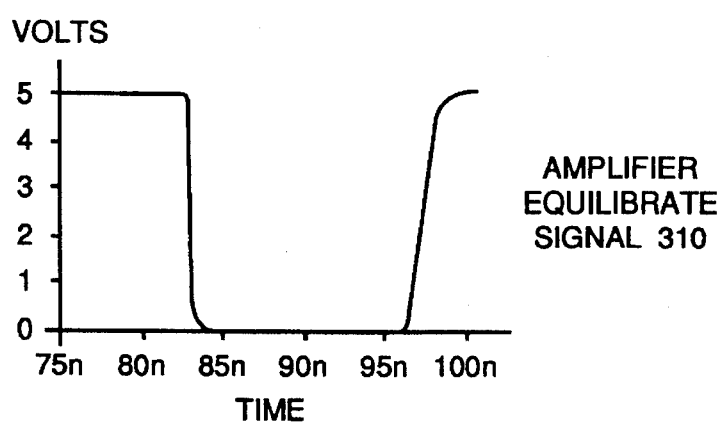
FIG. 8C — AMPLIFIER EQUILIBRATE SIGNAL 310
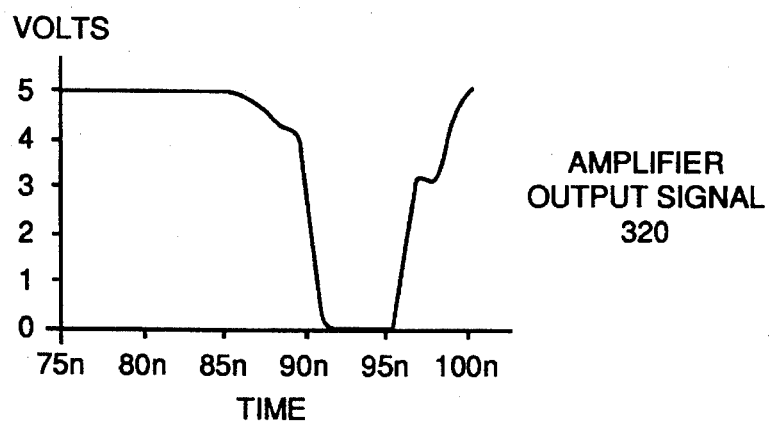
FIG. 8D — AMPLIFIER OUTPUT SIGNAL 320

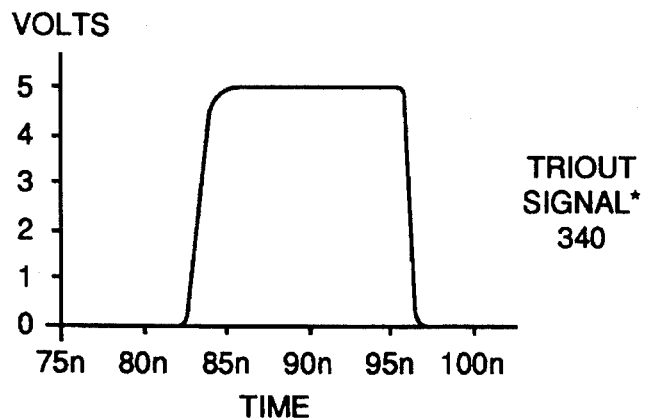
FIG. 8E — TRIOUT SIGNAL* 340
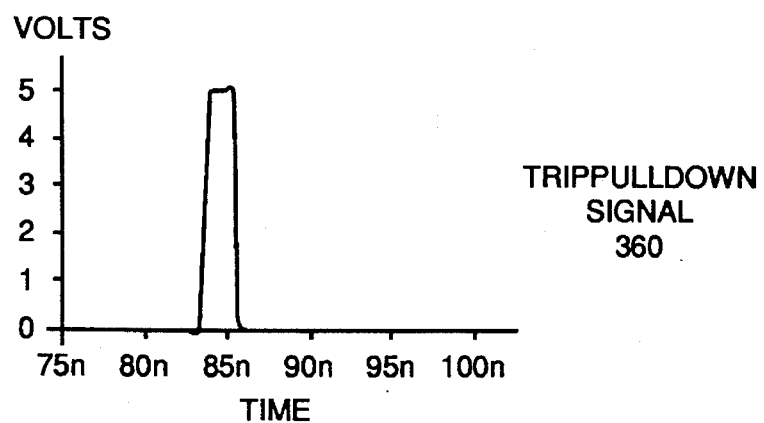
FIG. 8F — TRIPPULLDOWN SIGNAL 360
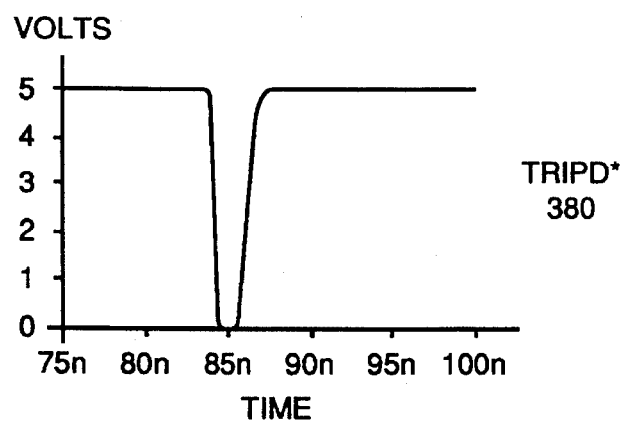
FIG. 8G — TRIPD* 380
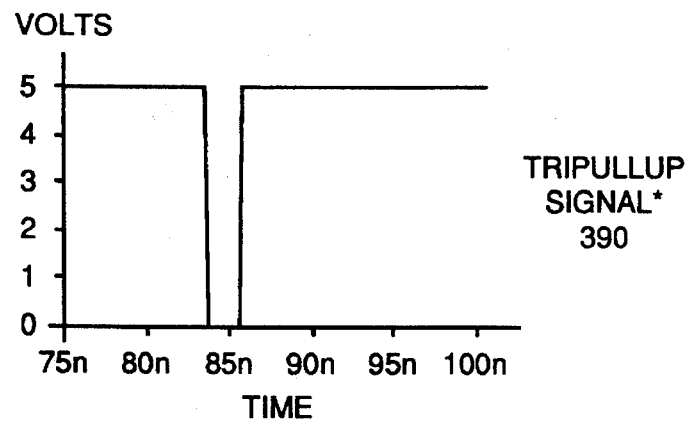
FIG. 8H — TRIPULLUP SIGNAL* 390

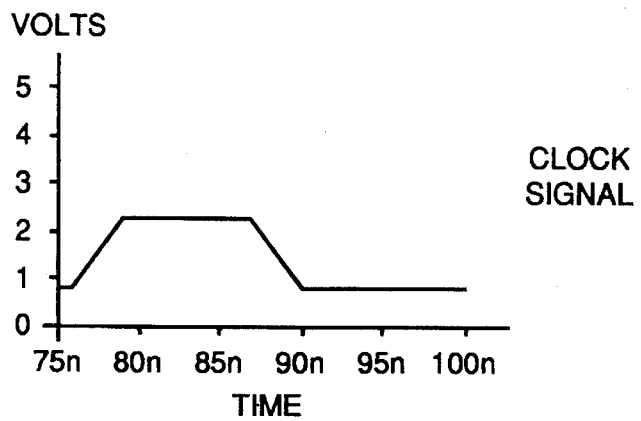
FIG. 9A — CLOCK SIGNAL
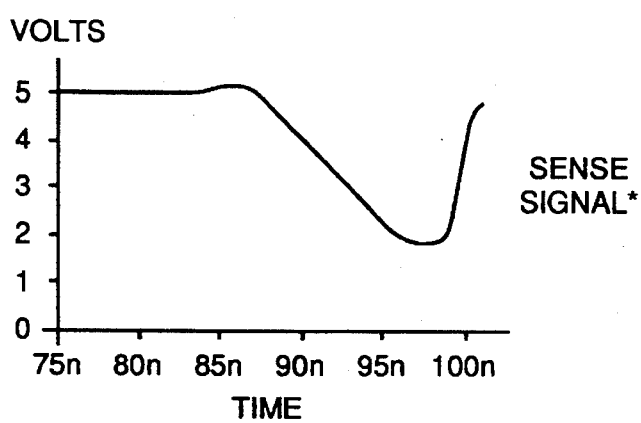
FIG. 9B — SENSE SIGNAL*
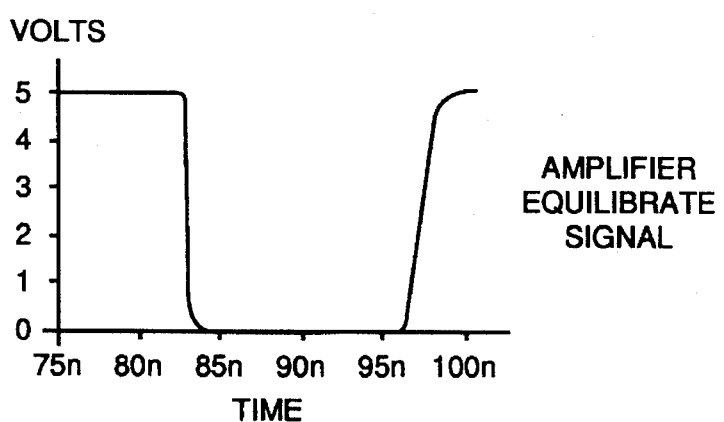
FIG. 9C — AMPLIFIER EQUILIBRATE SIGNAL
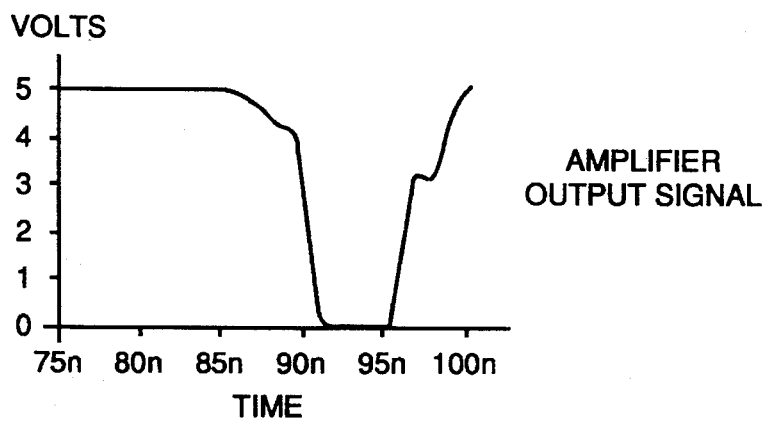
FIG. 9D — AMPLIFIER OUTPUT SIGNAL

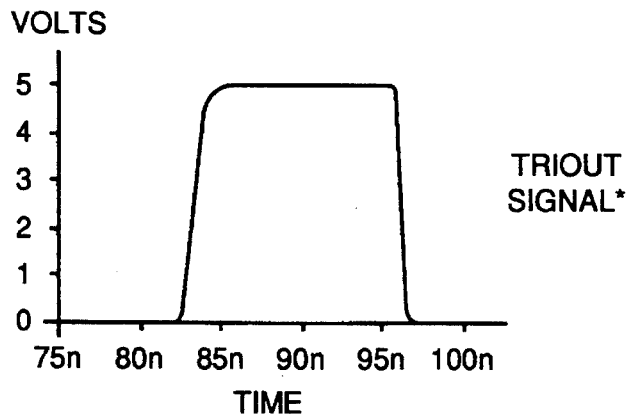
FIG. 9E — TRIOUT SIGNAL*
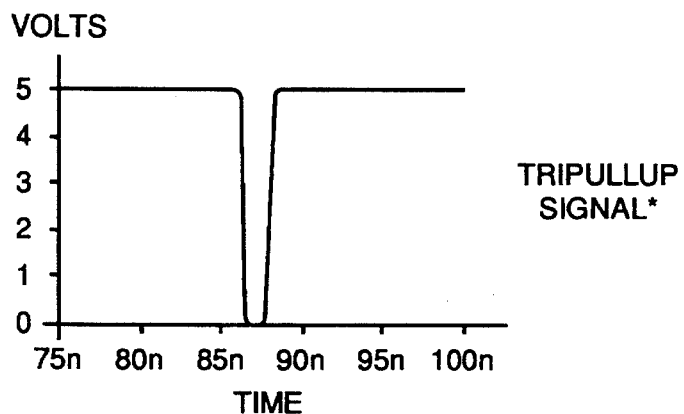
FIG. 9F — TRIPULLUP SIGNAL*
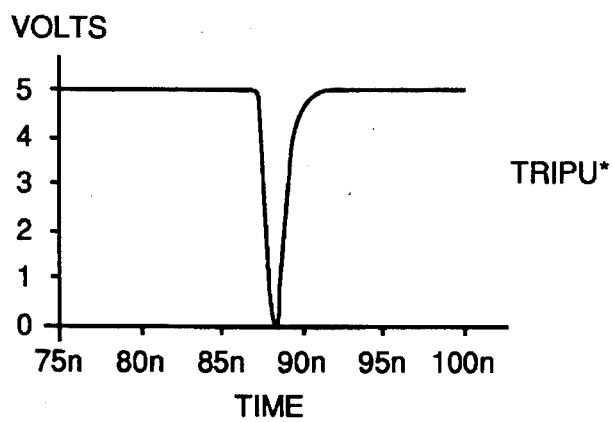
FIG. 9G — TRIPU*
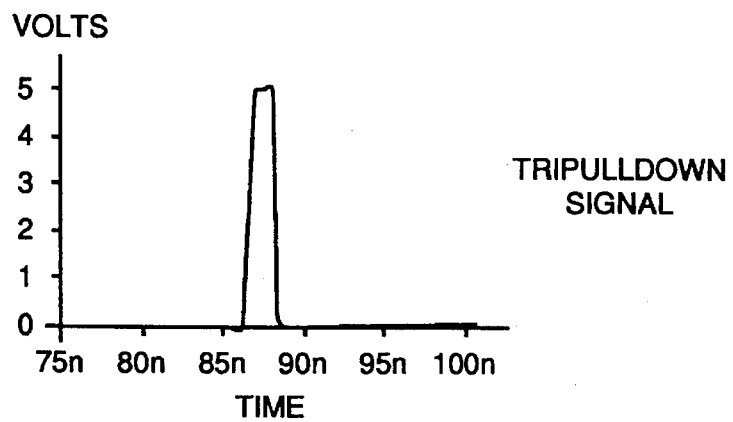
FIG. 9H — TRIPULLDOWN SIGNAL

TRUE TRISTATE OUTPUT BUFFER AND A METHOD FOR DRIVING A POTENTIAL OF AN OUTPUT PAD TO THREE DISTINCT CONDITIONS

FIELD OF THE INVENTION

The invention relates to memory circuits, and more particularly to circuits for driving an output pad to a potential capable of three distinct potentials.

BACKGROUND OF THE INVENTION

A conventional tristate output buffer circuit transmits binary data signals of high and low potential levels from an input node to an output node. The high and low potentials represent two of the three states of the output buffer circuit. Typically a tristate output buffer establishes a high impedance at the output pad for the third state.

FIG. 1 is a typical timing diagram of a serial access memory of the related art. During time periods 5 serial data, voltage out high, $v_{OH}$, and voltage out low, $v_{OL}$, is driven to the output pad. It can be seen from the timing diagram that there is a undefined time period 10 existing between the clocking of each bit of serial data to the output pad. The potential of the output pad during the undefined period 10 has a "don't care" condition.

It can be seen from the timing diagram that the serial data may transition from a $v_{OL}$ to a $v_{OH}$ or from a $v_{OH}$ to a $v_{OL}$. The length of time required for a node to transition from one potential to another is directly proportional to the change in voltage, delta V, between the two potentials. There is also an overshoot of the potential in the case where the potential transitions from a low to a high potential. The overshoot is defined as the potential difference between the maximum potential to which the node is driven and the desired potential being driven to the node. Similarly, in a transition from a high potential to a low potential undershoot occurs. In both cases there is ringing as the potential damps to the desired potential. Ringing occurs when the potential at the node fluctuates near the desired value until settling at the desired value. Overshoot, undershoot and ringing decrease the speed and integrity of the memory device. FIG. 2 is a timing representation of a simulation depicting the voltage 15 at the output pad and the voltage of a clock signal 20 of a circuit of the related art. The circuit is typified as having overshoot 25, undershoot 30 and ringing 35.

FIG. 3 is a simplified depiction of an output buffer 40 of the related art. A control circuit 45 provides the signals that actuate the output buffer 40. A high on the gate of transistor 50 drives the potential of the output pad 53 to a high logic level of a supply potential, $V_{cc}$, through transistor 50. A high on the gate of transistor 55 drives the potential of the output pad 53 to a low logic level of a reference potential at reference node 56 through transistor 55. When the gates of both transistors are at a low potential both transistors 50 and 55 are deactuated and high impedance is seen at the output pad 53. Although a high impedance appears at the output pad 53 the potentials initially driven to the output pad 53 have not dissipated appreciably. Therefore in order to drive the next bit of serial data to the output pad 53 the potential on the output pad 53 may have to transition between the extremes of the two logic levels. This large change in voltage creates overshoot and undershoot of the output signal and the subsequent ringing of the output signal before the desired logic level is driven to the output pad. Overshoot, undershoot, and ringing can decrease the speed of the memory device, negate normal noise margins, and cause damage to other parts connected to the bus.

In order to increase speed it is also desirable to eliminate crossing current. Crossing current represents a current surge which flows between power rails through the output buffer. It typically results from momentary, simultaneous activation of two series connected active devices located between the power rails. These current surges are undesirable because they cause excess power consumption and because they produce voltage degradation on the power and ground busses within the device. This voltage degradation can decrease device speed. For example, if transistor 50 actuates to drive the output pad 53 to a high logic level and transistor 55 does not turn off immediately there will be current flow through transistor 55 as well as transistor 50. By eliminating crossing current only one transistor will conduct current at any given time.

Pages 5-111 through 5-154 of the 1992 DRAM DATA BOOK by Micron Technology, Inc. and U.S. Pat. No. 4,953,130, by Theodore W. Houston, entitled MEMORY CIRCUIT WITH EXTENDED VALID DATA OUTPUT TIME are herein incorporated by reference to provide the reader with further information.

OBJECTS OF THE INVENTION

It is an object of the invention to decrease the delta V when driving a potential to the output pad of a memory device. The invention features a circuit and method for driving a midrange potential to the output between the serial transmission of data, thereby decreasing delta V. Decreasing delta V increases the speed in driving data to the output pad. Since decreasing delta V also reduces overshoot, undershoot and ringing, the final part is more likely to work in the system in which it is used.

A further object of the invention is the elimination of crossing current. The invention features circuitry for effecting the simultaneous deactuation of two series connected active devices located between the power rails. When data is driven to the output pad one of the devices is actuated while the other remains deactuated, thereby eliminating the possibility of crossing current.

SUMMARY OF THE INVENTION

The invention is directed to the use of a true tristate circuit for driving three distinct potentials to an output pad. Data having high and low logic levels is serially driven to the output pad from a midrange potential. The potentials having the first and second logic levels and the midrange potential are the three distinct potentials. Typically the first and second potentials represent high and low logic levels.

Between each bit of data transmission the circuit and method of the invention drive the midrange potential to the output pad. The midrange potential lies within a range of potentials defined by the potentials of the first and second logic levels. Typically the midrange potential is driven to the output pad during the undefined time period 10 of the memory cycle shown in FIG. 1. During the undefined time period 10 of the memory cycle there are no conditions imposed on the designer. Therefore the designer has the option of driving the output pad to any desired potential during the undefined time period. By driving the potential to the midrange potential during the undefined time period the delta V is decreased when the serial data is finally driven to the output pad.

A sense circuit detects the potential of the output pad. The sense circuit creates a sense signal. Logic circuitry enabled by a one shot generator responds to the sense signal and disables the NOR function of an enable NOR gate and drives the output of the enable NOR gate to a potential that activates an output buffer. The output buffer drives the output pad to the desired midrange potential.

In a further embodiment, the invention eliminates crossing current while driving the potential of the output pad to one of the three distinct potentials. The invention features control circuitry for disabling the output buffer prior to data transmission. Thus no current is flowing in the output buffer prior to the activation of the output buffer and current flow is restricted to flow between the output pad and only one power rail when the output buffer is activated.

The circuit and method of the invention eliminate crossing current and decreases the peak current requirement for driving the output to a valid logic level.

The invention decreases overshoot, undershoot, ringing and the change in voltage when data is driven to the output pad. Therefore the invention conserves power while decreasing noise and increasing the speed and integrity of the memory device.

BRIEF DESCRIPTION OF THE DRAWINGS

FIGS. 8A through 8I are timing representations showing signals pertaining to the circuit of FIG. 7 in a case where the output pad is driven from a high potential to a low potential.

FIGS. 9A through 9I are timing representations showing signals pertaining to the circuit of FIG. 7 in a case where the output pad is driven from a low potential to a high potential.

DETAILED DESCRIPTION OF THE INVENTION

Figure 1:
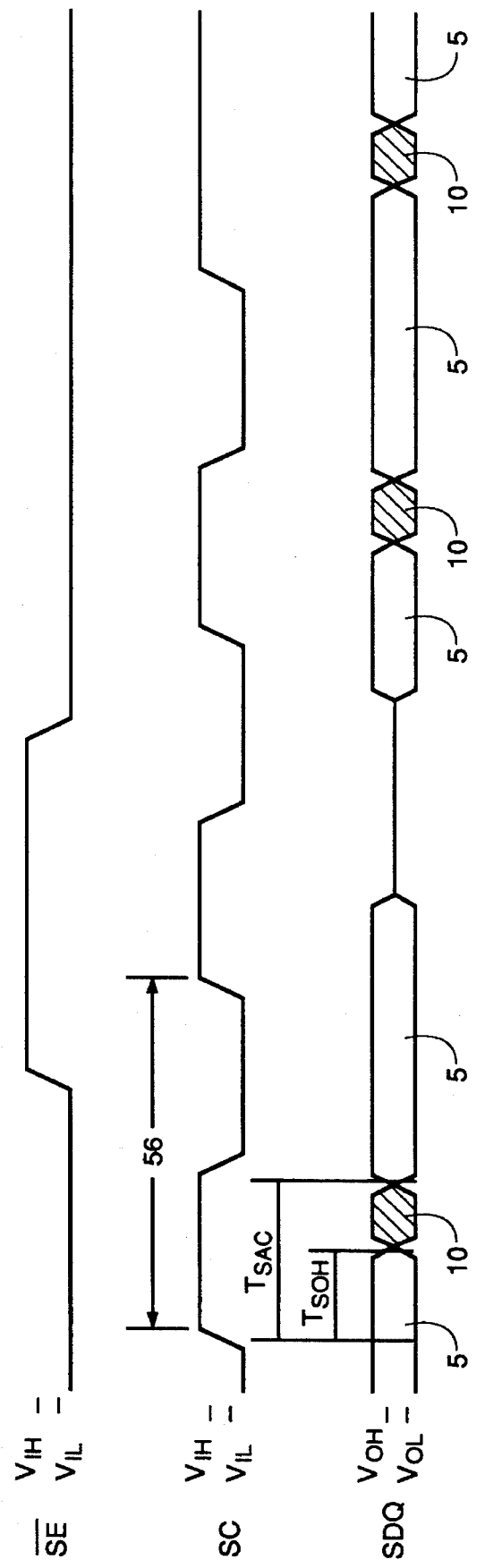
FIG. 1 is a typical timing diagram of a serial access memory of the related art.
Figure 2:
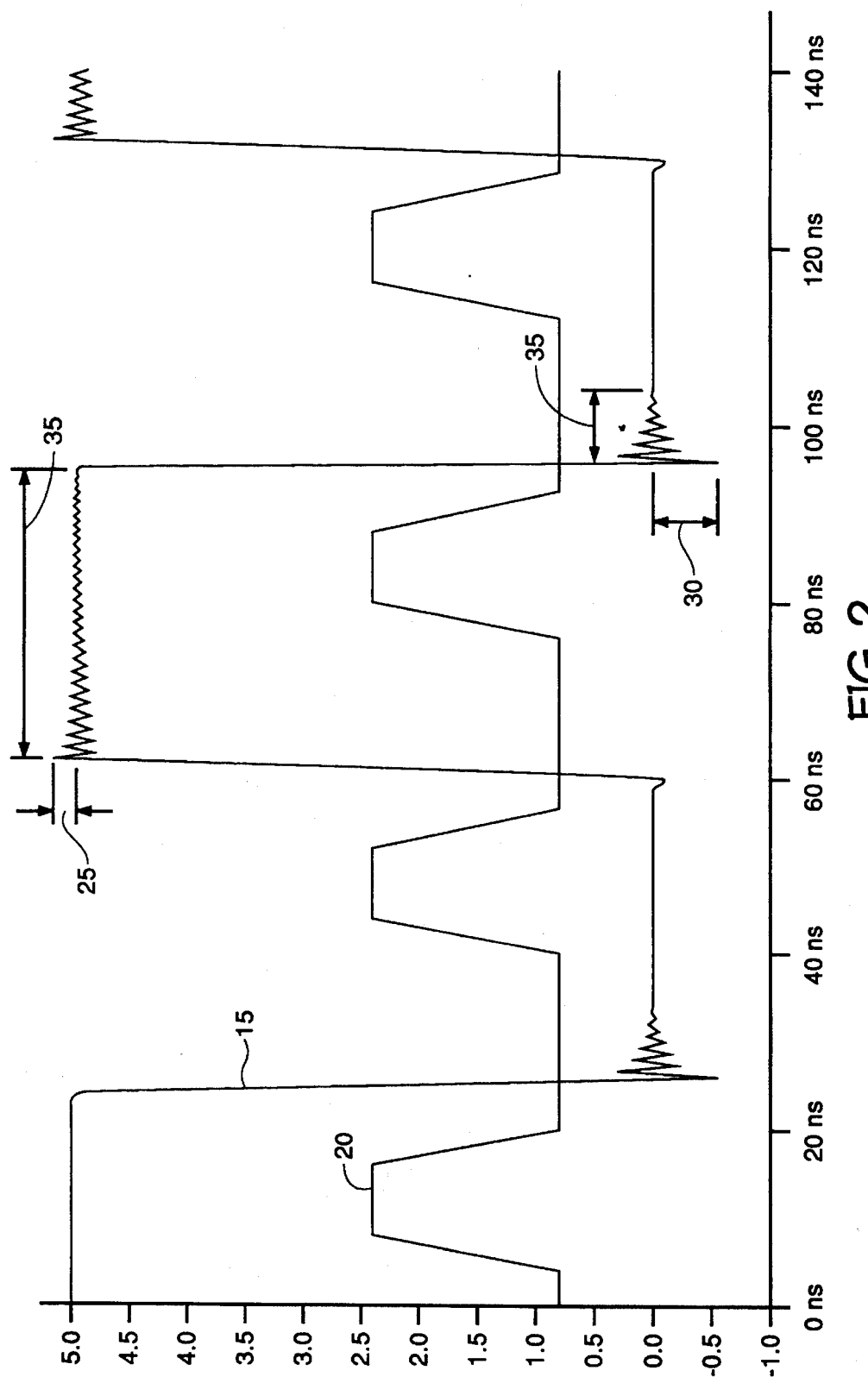
FIG. 2 is a timing representation depicting the voltage at an output pad and the voltage of a clock signal of a circuit of the related art.
Figure 3:
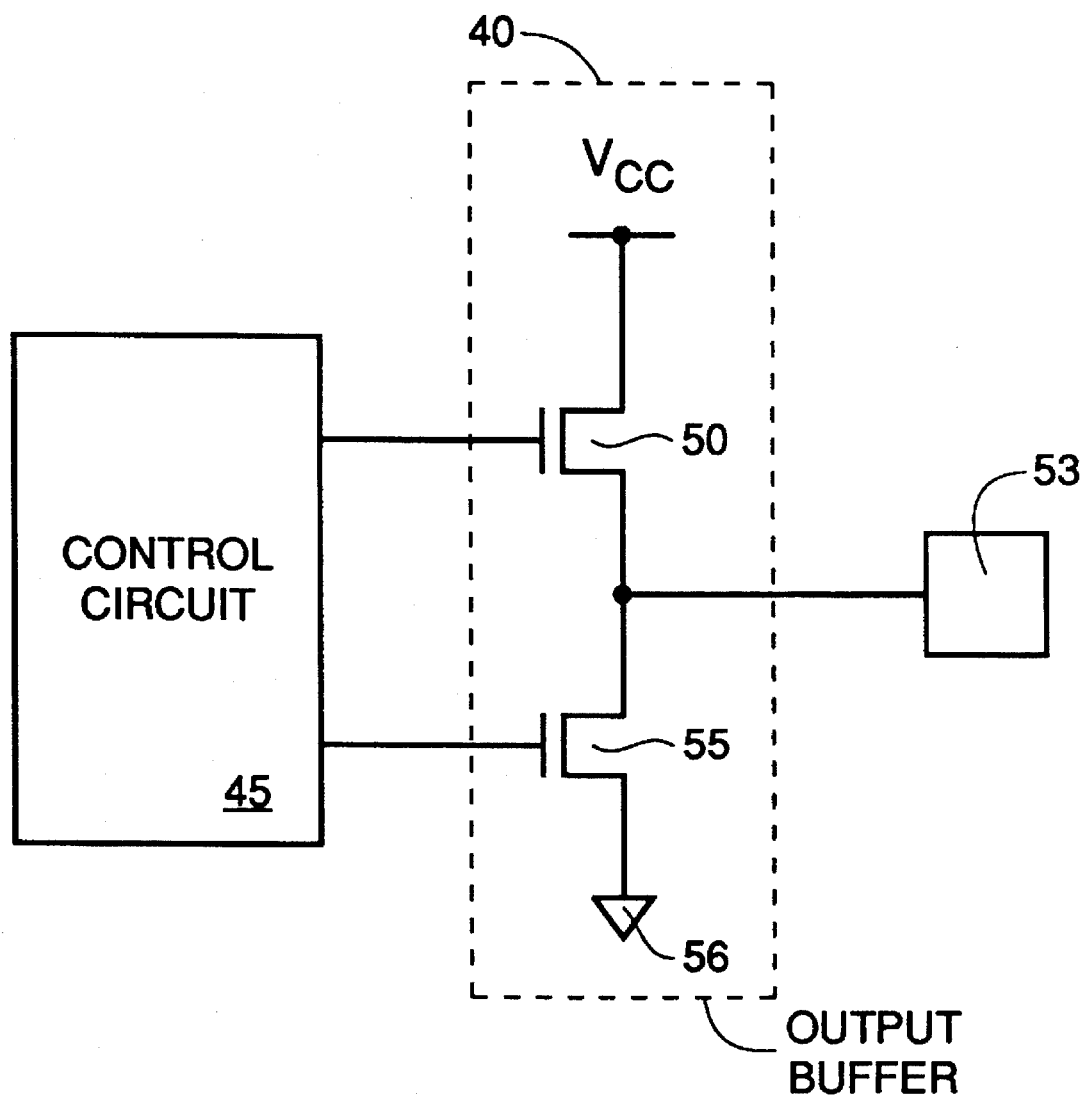
FIG. 3 is a simplified depiction of an output buffer circuit of the related art.

One application of the true tristate circuit of the invention pertains to a memory device where the data is serially transferred to the output pad. FIG. 1 is an example of a timing diagram depicting serial output data, SDQ, of a multi-port Dynamic Random Access Memory, DRAM, device. The serial data is clocked to the output pad during time periods 5 in response to the serial clock signal, SC, having a cycle time 56. The serial clock signal is enabled by a low serial enable signal, SE*. During this detailed description of the invention it is important to note that all events relate to a rising edge of the serial clock signal.

The time between the clock's rising edge and the data finally getting to the output pad is where the invention is centered. When the serial clock transitions from a low, $v_{IL}$, to a high, $v_{IH}$, potential, serial data on the output pad must remain for a serial hold time, $T_{SOH}$, and the next consecutive serial bit of data must be presented on the output before a serial access time, $T_{SAC}$. There is an undefined time period 10 lying between the time when the $T_{SOH}$ terminates and the time when the $T_{SAC}$ is to be met. During the undefined time period 10 the potential on the output pad is undefined, and there are no special condition requirements. Rather than allowing the data to remain on the output pad or to float to an unknown value during the undefined time period 10, the invention generates a midrange potential during the undefined time period 10. The midrange potential lies within the range of potentials having limits defined by an output potential having a high logic level, $v_{OH}$, and an output potential having a low logic level, $v_{OL}$. In an ideal case this potential is a midpoint potential equal to approximately half of the sum of the low and high potentials driven to the output pad.

Figure 4:
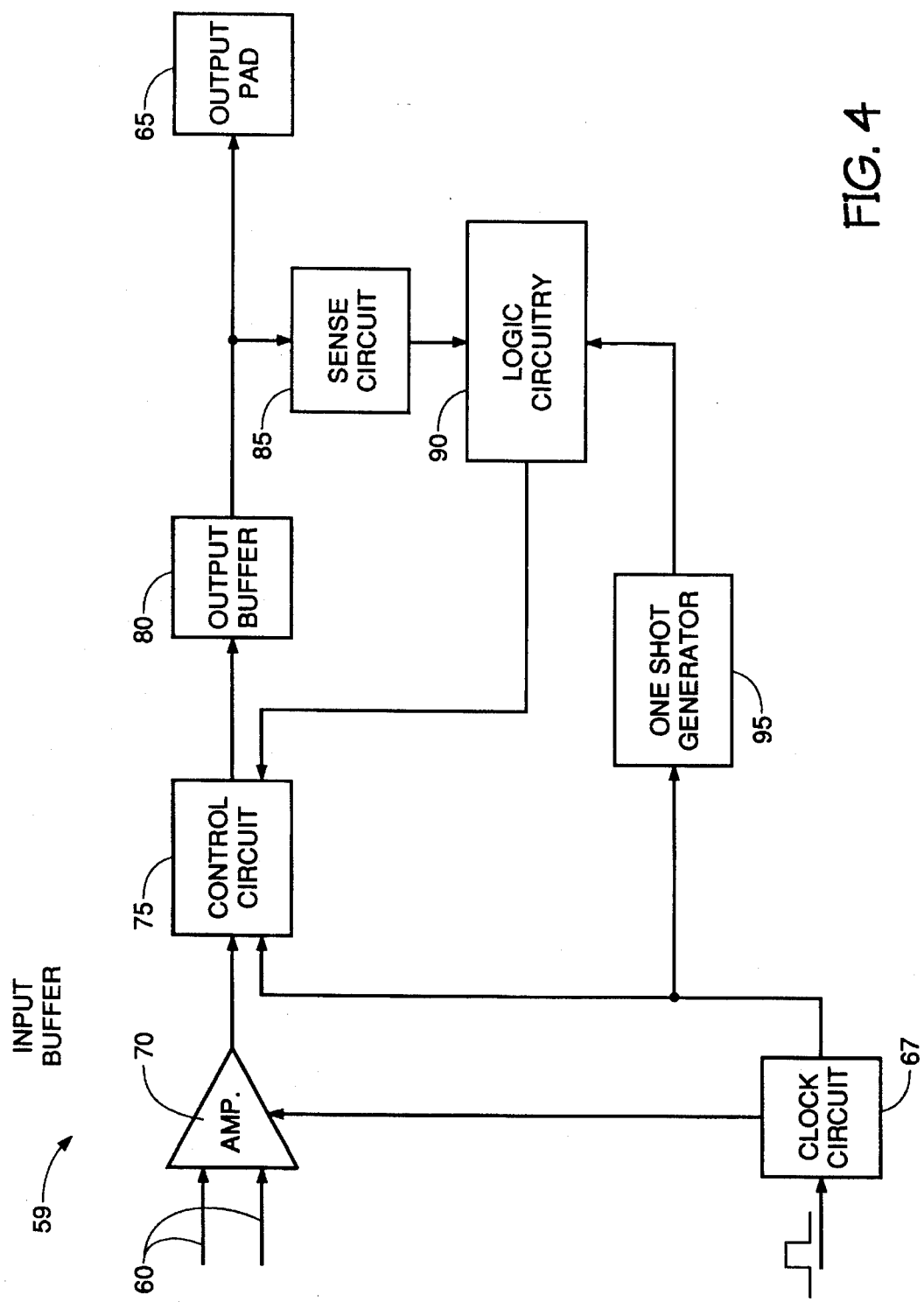
FIG. 4 is a block schematic of the true tristate circuit of the invention.

FIG. 4 is a block schematic of the true tristate circuit 59 of the invention. In the circuit of FIG. 4 the data on sense lines 60 is serially driven to the output pad 65. A clock circuit 67 terminates the active state of an amplifier equilibrate signal in response to an initial clock signal. Thus equilibration of the data is terminated and the inactive state of the amplifier equilibrate signal effectively allows the data to be amplified to control circuit 75 through an amplifier circuit 70. The clock circuit 67 also generates a TRIOUT signal which clocks the amplified data through the control circuit 75 to an output buffer 80. The output buffer 80 drives the data to the output pad 65.

Typically the amplifier circuit 70 is configured as a helper flip-flop or a differential amplifier, and is responsible for amplifying the data. However, it can also be thought of as an input buffer for driving the data to the control circuit with minimal loss. Both the helper flip-flop and the amplifier are circuits well known to those skilled in the art.

It should be noted that before the data has been driven to the output pad 65 the output buffer is deactivated in response to the amplifier equilibrate signal and the TRIOUT signal. Therefore no current flows in the output buffer 80, and when the output buffer eventually drives the data to the output, crossing current has been eliminated.

A sense circuit 85 monitors the potential of the output pad 65. The sensing circuit 85 provides a signal to logic circuitry 90 indicative of the potential of the output pad 65. The logic circuitry 90 is enabled, during the undefined time period, by an output pulse from a one shot generator 95. The one shot generator 95 is actuated by the TRIOUT signal. When enabled, the logic circuitry 90 provides an override signal to the control circuit 75 which disables the NOR function of an enable NOR gate (not shown) and drives the output of the enable NOR gate high. The enable NOR gate is internal to the control circuit 75. The high enable NOR output actuates the output buffer 80 to drive the output pad 65 to the potential having the midrange potential.

The pulse width of the output pulse of the one shot generator 95 is designed such that the potential of the output pad 65 only has time to be driven to the midrange potential and no further. This is caused by the potential from the one shot generator 95 returning to its normal state after the pulse. Therefor the logic circuitry 90 is no longer enabled. When the potential from the one shot generator 95 returns to its normal state, the output buffer 80 returns to its deactuated state.

Alternately, as the potential on the output pad is driven toward the midrange potential the output potential may transition past the sense circuit trip point. In this case the signal provided by the sense circuit may change states and deactuate the output buffer before the termination of the output pulse. Thus the frequency response determining the midrange potential my be controlled by either the pulse width control technique or the sensitivity of the sense circuit.

An enable Nor gate has three inputs. A signal on the third input, also known as the enable input, enables and disables a NOR function of the gate. When enabled the enable NOR gate functions according to the truth table of a typical NOR gate with respect to potentials on the first and second inputs. When disabled the output of the enable NOR gate is driven to a high potential regardless of the potentials on the first and second inputs.

Figure 5:
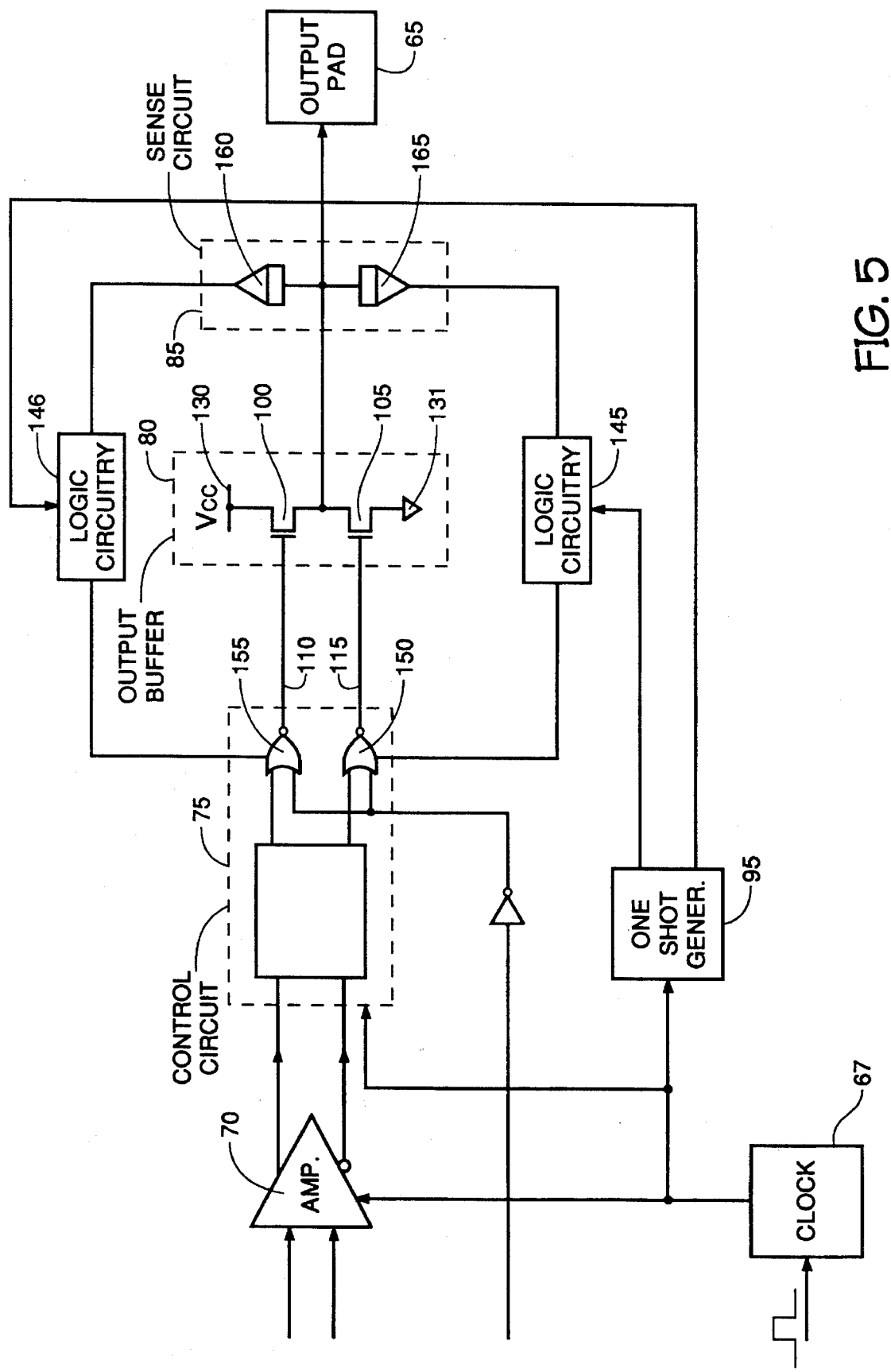
FIG. 5 is a detailed block schematic of the true tristate circuit of the invention.

FIG. 5 is a more detailed block schematic of the invention. The output buffer 80 comprises first 100 and second 105 driving devices. In the circuit of FIG. 5 NMOS transistors function as the first and second driving devices 100 and 105. The actuation and deactuation of the first 100 and second 105 driving devices is controlled by signals at outputs 110 and 115 of the control circuit 75. The actuation and deactuation of the first 100 and second 105 driving devices controls the potential of the output pad 65. The high logic level of the supply potential, at supply node 130, is driven to the output pad 65 through an activated first driving device 100, and the low logic level of the reference potential, at reference node 131, is driven to the output pad 65 through an activated second driving device 105. Therefore when the data has been transferred to the output pad 65 the potential of the output pad 65 has a high or a low logic level.

In order to improve the speed and integrity of the memory device the circuit of the invention pulls the output pad 65 to a midrange potential between consecutive cycles of serial data output. Before the potential of the output pad 65 is driven to the midrange potential, the control circuit 75 generates low potentials at outputs 110 and 115 in response to the amplifier output signal and TRIOUT signal. The low potentials at outputs 110 and 115 deactuate both first 100 and second 105 driving devices and no current flows in the output buffer 80, and all crossing current is eliminated.

The sense circuit 85, the one shot generator 95, logic circuitry 145 and 146 and enable NOR gates 150 and 155 are responsible for generating the midrange potential between cycles of serial data output. The enable NOR gates 150 and 155 are incorporated into the control circuit 75 and are used to control the pull up and pull down of the output buffer.

The sense circuit 85 comprises a first 160 and a second 165 potential detector. The first potential detector 160 detects when the potential on the output pad 65 is less than a predetermine trip value. For example, the potential detector 160 may be configured so as to provide an active signal to logic circuitry 146 for potentials below 1 volt. The second potential detector 165 detects when the potential on the output pad 65 is greater than a predetermined trip value. For example, the potential detector 165 may be configured so as to provide an active signal to logic circuitry 145 for potentials above 2 volts. Potential detector circuits are well known to those skilled in the art.

The logic circuitries 145 and 146 are enabled during the undefined time period 10 in order to drive the midrange potential to the output pad 65. The clock circuit 67 determines when the logic circuitry 145 and 146 is enabled. The clock circuit 67 generates the TRIOUT signal to activate the one shot generator 95. The one shot generator 95 provides a tripullup pulse* to enable logic circuitry 146 and provides a tripulldown pulse to enable logic circuitry 145. In the case where a low potential is detected by first potential detector 160 and the logic circuitry 146 is enabled by the tripullup pulse*, the logic circuitry 146 provides a signal to disable the NOR function of the enable NOR gate 155 and provides a high potential at the output 110. The first driving device 100 is actuated by the high potential on output 110, and the potential of the output pad 65 is pulled from the low potential to the midrange potential. Before the potential of the output pad it pulled to a full value of the supply potential, the potential detector 160 should trip off deactivating logic circuitry 146 and enable NOR gate 155. In addition when the tripullup pulse* terminates the logic circuit 146 is disabled. In a case where a high is detected by the second potential detector 165 the corresponding circuit components react similarly to bring the potential of the output pad to the midrange potential.

Thus the potential of the output pad 65 is controlled, in conjunction with the enable NOR gates 150 and 155 of the control circuit 75 and the output buffer 80, by the pulse width of the tripullup pulse* as well as potential detectors 160 and 165.

Figure 6:
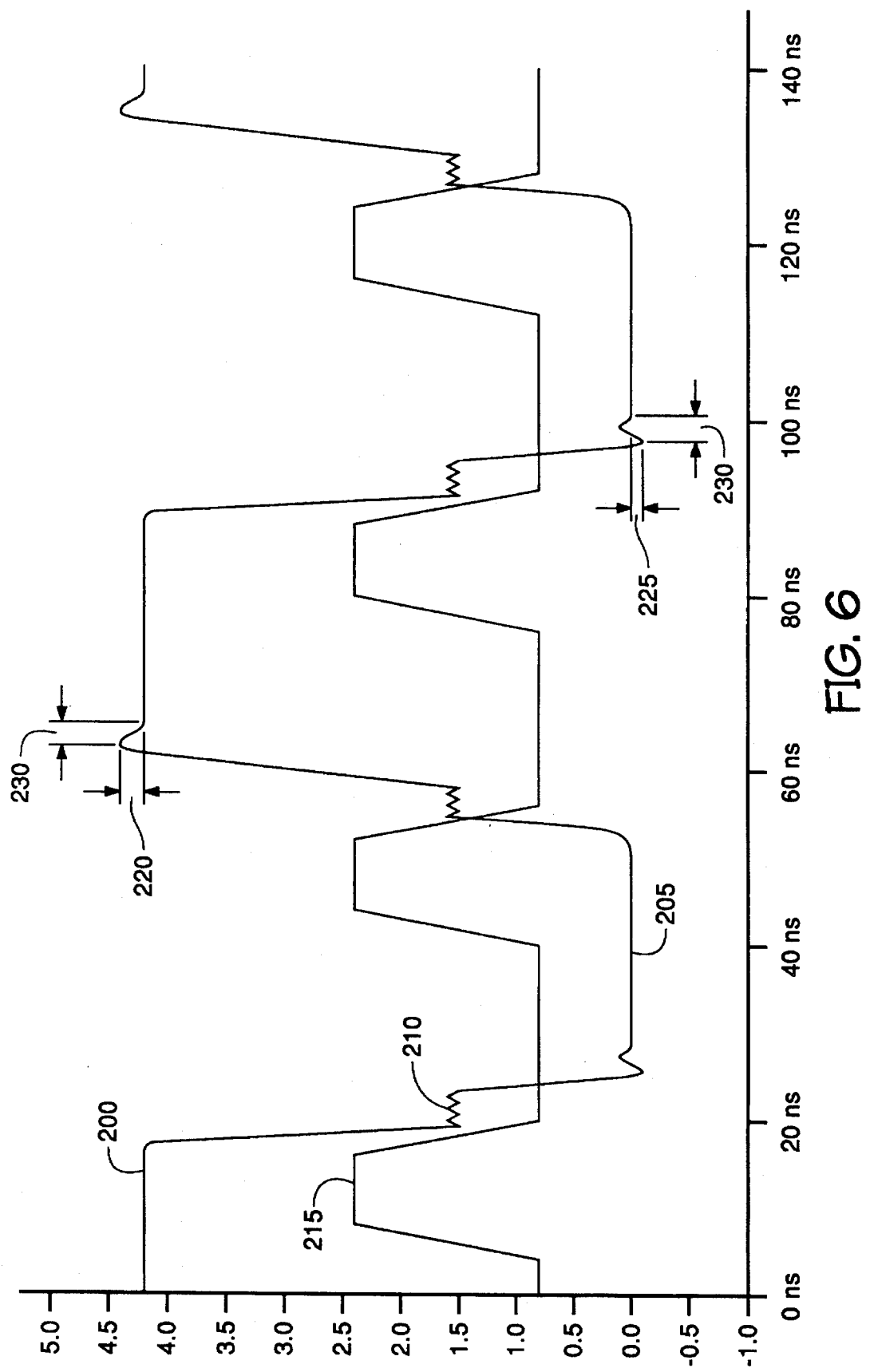
FIG. 6 is a timing representation depicting the three distinct output potentials driven to the output pad by the circuit and method of the invention in relation to the serial clock signal.

FIG. 6 is a timing representation depicting the three distinct output potentials (the high 200, low 205, and midrange 210 potentials) driven to the output pad by the circuit and method of the invention in relation to the serial clock signal 215. The circuit of the invention reduces overshoot 220, undershoot 225, and ringing 230 of the high and low potentials.

Figure 7:
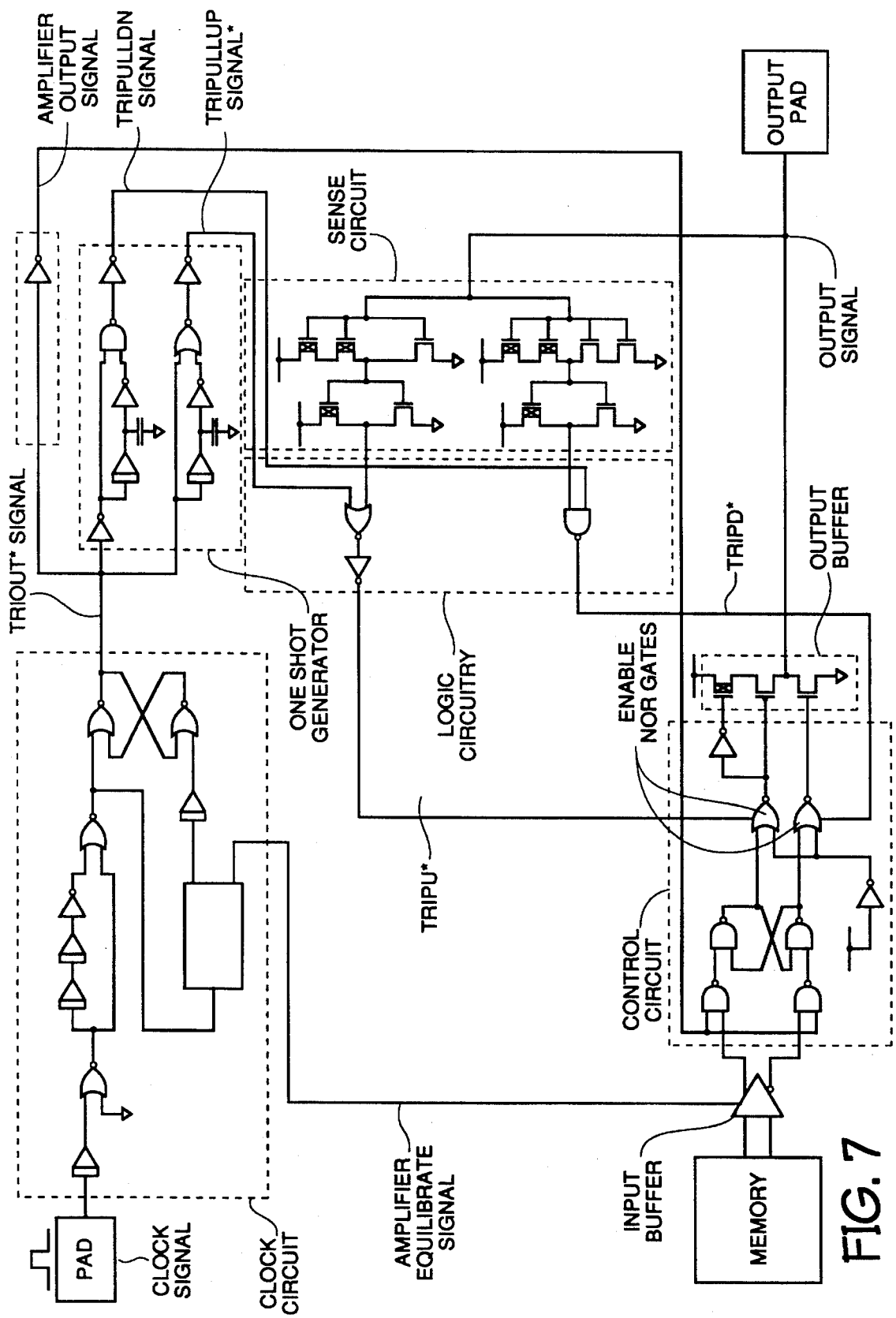
FIG. 7 is a detailed schematic of the circuit of a preferred embodiment of the invention.
Figure 8I:
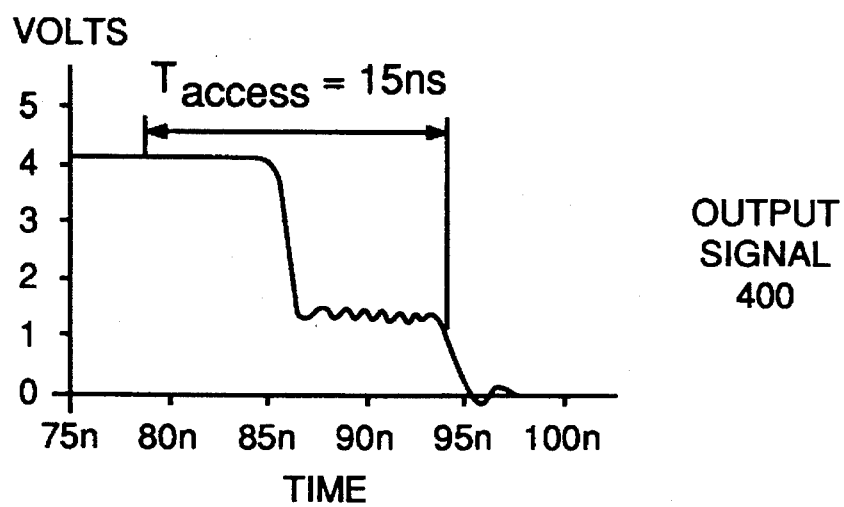
Figure 9I:
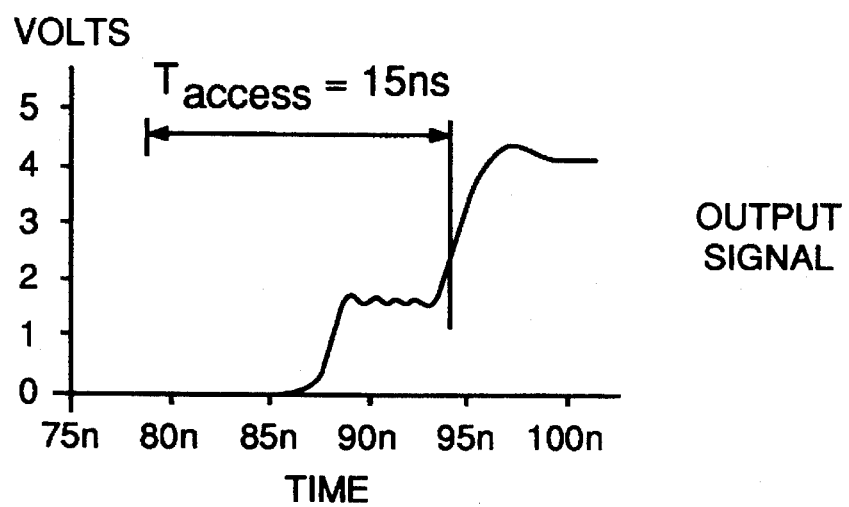

FIG. 7 is a detailed schematic of a preferred embodiment of the invention. Block components corresponding to block components of FIG. 5 are shown by dashed lines and have been labeled. FIGS. 8A–8I and 9A–9I are timing diagrams showing signals pertaining to the circuit of FIG. 7. FIGS. 8A–8I show the signals in a case where the output pad is driven from a high potential to a low potential. The lines representing the pertinent signals have been numbered in increments from 300 to 400. FIGS. 9A–9I show the signals in a case where the output pad is driven from a low potential to a high potential. Signal names corresponding to signals depicted in FIGS. 8A–8I and 9A–9I have been provided at appropriate locations in FIG. 7.

Figure 10:
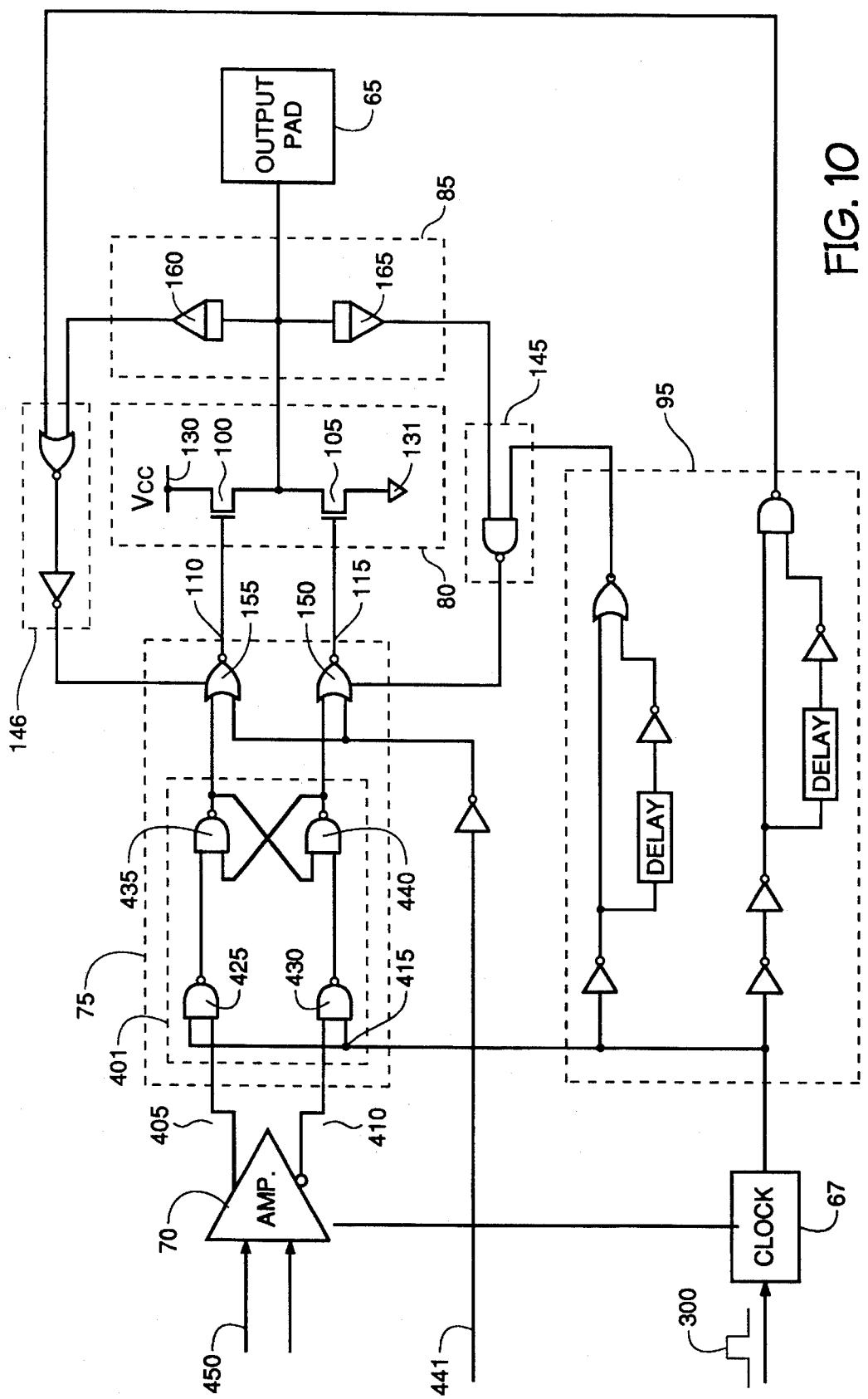
FIG. 10 is a simplified depiction of the circuit of FIG. 7.

FIG. 10 is a simplified depiction of the circuit of FIG. 7. Although the signals shown in the timing diagrams of FIGS. 8A–8I and 9A–9I pertain to FIG. 7, a description of the signals with respect to simplified FIG. 10 will provide an understanding of the invention. The circuit components of FIG. 10 corresponding to circuit components of FIG. 4 are identically numbered. The block components are shown by dashed lines.

Referring now to FIGS. 8A–8I and 10, the clock signal 300 triggers the clock circuit 67 which then terminates the active state of the amplifier equilibrate signal 310 and generates the TRIOUT signal 340. The amplifier equilibrate signal 310 and the TRIOUT signal 340 are substantially complementary signals. When the TRIOUT signal 340 is low data is latched to the output pad through latch circuitry 401.

While the amplifier equilibrate signal 310 is high the amplifier 70 responds internally to create high output signals at the control circuit inputs 405 and 410. In response to the rising edge of the clock 300 the TRIOUT signal 340, which is the input signal at control circuit input 415, goes high and the amplifier equilibrate signal 310 goes low. When all three control circuit input signals are high, both of the control circuit outputs 110 and 115 are low thereby deactuating both driving devices 100 and 105. Since the circuit of the invention deactuates both output driving devices 100 and 105, current flow is prohibited in both driving devices. Eventually data arrives at the amplifier and causes one of the amplifier output signals at control circuit inputs 405 and 410 to go low which in turn actuates only one of the driving devices, since the remaining driving device is already deactuated. Thus when output driving device 100 is activated output driving device 105 is deactivated and when output driving device 105 is activated output driving device 100 is deactivated. Thus crossing current is eliminated since the circuit prohibits the simultaneous actuation of both driving devices.

More specifically, when the input signals on control circuit inputs 405, 410, and 415 are high the output signals of NAND gates 425 and 430 are low. The low output signals of NAND gates 425 and 430 drive the output signals of NAND gates 435 and 440 high. Since the enable NOR gates are enabled by a high potential on their respective inputs and since the output signals of NAND gates 435 and 440 are high, the output signals of the enable NOR gates 150 and 155 are low. Thus both driving devices 100 and 105 are deactuated.

It should be noted that the potential at node 441 is typically generated external of the DRAM device, although internal generation is possible. The signal acts as an output enable/disable for bus control purposes.

After both driving devices 100 and 105 have been deactuated the circuit of the invention takes the output pad 65 to the midrange potential according to the following steps. The TRIOUT signal 340 activates the one shot generator which generates a tripullup signal* 390 and a tripulldown signal 360. The tripullup* and tripulldown signal 390 and 360 each comprise a pulse which enables the logic circuitries 146 and 145, respectively, such that when the sense circuit 85 senses a high potential the logic circuitry 145 generates a triPD* signal 380 to disable the NOR function of the enable NOR gate 150 and provide a high signal at output 115. The high output signal at output 115 activates the driving device 105 bringing the potential on the output pad 65 toward the reference potential. The pulse widths of the pulses generated by the one shot generator 95 are controlled by the one shot generator 95. When the pulses terminate and the tripulldown signal 360 and tripullup signal* 390 return to their normal state the logic circuitries 145 and 146 are disabled. The one shot generator 95 is designed such that it generates pulses having pulse widths which only allow the output signal 400 to be pulled to a midrange potential and no further.

Alternately the sense circuit 85 may control the value of the midrange potential by generating a signal in response to the change in potential of the output pad. As the potential of the output pad is pulled toward the midrange potential it may transition past the trip point of the respective potential detector and, in response to the transition, generate a signal which enables the NOR function of the enable NOR gate, thereby providing a low signal to deactuate the output buffer 80. Thus, the sense circuit output can control the midrange potential in a case where the pulse has not been terminated before the output potential transitions past the trip point as it is pulled toward the midrange potential.

After the output pad 65 has been driven to the midrange potential and the logic circuitries 145 and 146 have been disabled the next bit of data is amplified and driven towards the output pad.

The data represented by the sense signal 305 on the input terminal 450 of the amplifier 70 is amplified by the amplifier 70 in response to the amplifier equilibrate signal 310 going low. This amplification can be seen by noting the drop in potential of the amplifier output signal 320 corresponding to the decrease in potential of the sense signal 305. After the control circuit input signals have all gone high, the amplifier output signal 320 becomes an input signal at the control circuit input terminal 410 and the inverse potential is an input signal at the control circuit input terminal 405.

The amplifier output signal 320 is driven from control circuit input 410 to the output pad 65. The control circuit 75 is enabled by the high TRIOUT signal 340 and, in this example, an externally applied high signal at node 441. The output of NAND gate 430 then goes high and the output of NAND gate 425 remains low. Since the outputs of NAND gates 435 and 440 were previously high, the output of NAND gate 435 remains high and the output of NAND gate 440 now goes low. A low on an enabled enable NOR gate 150 takes the output of enable NOR gate 150 high and a high on an enable NOR gate 155 keeps the output of enable NOR gate 155 low. Thus driving device 100 remains deactuated and driving device 105 is actuated and the output signal 400 is driven toward the low reference potential though driving device 105. Since both driving devices 100 and 105 were never simultaneously actuated crossing current has been eliminated due to the initial deactuation of both driving devices 100 and 105 as a result of all three inputs 405, 410, and 415 being initially high. The low potential of the output signal 400 is latched to the output pad 65 by latching circuit 401 when the TRIOUT signal 340 goes low. Since the output signal 400 was at the midrange potential the circuit responds quickly to drive the output signal 400 from the midrange potential to the low potential. This is due to the fact that delta V has been decreased. Overshoot, undershoot and ringing are also reduced due to the decrease in delta V. It can be seen by studying the timing diagrams depicted in FIG. 9 that the circuit behaves similarly when driving data having a high potential to the output pad.

It has been shown that the invention provides a circuit and method for increasing speed, decreasing overshoot, undershoot, and ringing while conserving power.

Although the invention has been described in terms of a serial access memory for providing a true tristate output, the circuit and method have utility in other circuits where a true tristate output is desired. Accordingly the invention should be read as limited only by the claims.

What is claimed is:

1. A tristate circuit for driving three distinct potential ranges to an output pad, said three distinct potential ranges designated as a first condition, a second condition and a third condition, the circuit comprising:

a) a first driving device coupled to the output pad, said first driving device capable of driving the output pad to the first condition when activated;

b) a second driving device coupled to the output pad, said second driving device capable of driving the output pad to the second condition when activated;

c) a sense circuit, coupled to said output pad, for sensing a potential at the output pad and for generating a first sense signal in response to said first condition being on the output pad and for generating a second sense signal in response to said second condition being on the output pad;

d) a logic circuit, coupled to said sense circuit, for receiving said first and second sense signals and capable of generating an override signal in response to said first and second sense signals when enabled;

e) a one shot generator, coupled to said logic circuit, for generating a pulse, said pulse enabling said logic circuit; and f) a control circuit, coupled to said first and second driving devices and coupled to said logic circuit, said control circuit controlling an activation and deactivation of said first and second driving devices, said control circuit responding to said override signal such that said first driving device is activated to drive the output pad to said third condition when said second condition is on said output pad and such that said second driving device is activated to drive the output pad to said third condition when said first condition is on the output pad.

2. The tristate circuit as specified in claim 1, wherein said pulse has a pulse width, said pulse width determining a time period during which an output potential of said output pad transitions to said third condition from one of said first condition and said second condition.

3. The tristate circuit as specified in claim 1, further comprising a crossing current elimination circuit to ensure a deactivation of said first driving device and eliminate current flow in said first driving device when said second condition is driven to the output pad, and to ensure a deactivation of said second driving device and eliminate current flow in said second driving device when said first condition is driven to the output pad.

4. The tristate circuit as specified in claim 1, further comprising a crossing current elimination circuit for providing a first concurrent deactivation of said first and second driving devices prior to driving said first and second conditions to said output pad.

5. The tristate circuit as specified in claim 4, wherein said crossing current elimination circuit provides a second concurrent deactivation of said first and second driving devices prior to driving said third condition to said output pad.

6. The tristate circuit as specified in claim 1, wherein said control circuit responds to data stored in a memory device to regulate said activation and said deactivation of said first and second driving devices thereby coupling said data, represented by said first and second conditions, to said output pad.

7. The tristate circuit as specified in claim 1, wherein said sense circuit provides a third sense signal, for disabling said logic circuit thereby terminating said override signal, when the potential of said output pad transitions from said first condition past a first trip point and when the potential of said output pad transitions from said second condition past a second trip point.

8. A memory circuit for recalling data stored therein, said memory circuit comprising:

a) an input buffer for receiving the data;

b) an output pad for presenting the data;

c) an output buffer, electrically interposed between said input buffer and said output pad, for driving an output potential to said output pad, said output potential capable of representing the data;

d) a control circuit electrically interposed between said input buffer and said output buffer, said control circuit determining a value of said output potential driven to said output pad by said output buffer;

e) a sense circuit, coupled to said output pad, for sensing said output potential and for generating a sense signal in response to said output potential;

f) a logic circuit, electrically interposed between said control circuit and said sense circuit, said logic circuit receiving said sense signal, and providing active and inactive signals to said control circuit; and g) a generator, coupled to said logic circuit, for generating a pulse to enable said logic circuit, wherein i) when said logic circuit is enabled and said sense circuit senses a first potential on said output pad said logic circuit provides said active signal to said control circuit, wherein said control circuit responds to said active signal and provides an override potential to activate said output buffer thereby driving said output potential from said first potential to a midrange potential, and wherein ii) when said logic circuit is enabled and said sense circuit senses a second potential on said output pad said logic circuit provides said active signal to said control circuit, wherein said control circuit responds to said active signal and provides said override potential to activate said output buffer thereby driving said output potential from said second potential to said midrange potential, said midrange potential having a value lying between a value of said first potential and a value of said second potential.

9. The memory circuit as specified in claim 8, wherein a pulse width of said pulse is regulated by said generator in order to control a time period during which said output buffer drives said output potential from said first and second potentials to said midrange potential.

10. The memory circuit as specified in claim 8, wherein said control circuit comprises at least a first, a second, and a third input terminal and an output terminal, said logic circuit coupled to said third input terminal, potentials, capable of first and second logic states, clocked from said input buffer to said first and second input terminals thereby determining a logic state of a potential on said output terminal indicative of said data, said inactive signal on said third input terminal enabling said control circuit to respond to said potentials on said first and second input terminals, said active signal on said third input terminal overriding said potentials on said first and second input terminals to create said override potential on said output terminal, said override potential activating said output buffer to drive said output potential to said midrange potential.

11. The memory circuit as specified in claim 8, wherein said output buffer comprises:

a) a first driving device capable of driving said output potential toward said first potential; and b) a second driving device capable of driving said output potential toward said second potential.

12. The memory circuit as specified in claim 11, wherein said control circuit comprises:

a) a first enable logic gate for receiving said active signal from said logic circuit in response to said first potential on said output pad, said first enable logic gate providing said override potential to activate said second driving device; and b) a second enable logic gate for receiving said active signal from said logic circuit in response to said second potential on said output pad, said second enable logic gate providing said override potential to activate said first driving device.

13. The memory circuit as specified in claim 8, wherein said sense circuit is responsive to said output potential such that when said output potential lies between a first trip point potential and a second trip point potential said sense circuit generates a shut down sense signal, said logic circuit responding to said shut down sense signal by providing said inactive signal to said control circuit thereby effecting a deactivation of said output buffer and a termination of said driving said output potential to said output pad.

14. A method for recalling data stored in a memory circuit, comprising the following steps:
 a) activating an output buffer for a first time in response to the recalled data;
 b) driving an output potential of an output pad to a first potential within a first range of potentials or to a second potential within a second range of potentials, said first and second potentials representing the data, said step of driving performed in response to said step of activating;
 c) sensing said output potential to determine when said output potential is greater than a first trip point potential and to determine when said output potential is less than a second trip point potential;
 d) overriding said step of activating in response to said output potential being greater than said first trip point potential or less than said second trip point potential;
 e) activating said output buffer for a second time in response to said step of overriding; and
 f) driving said output potential to a midrange potential in response to said step of activating said output buffer for the second time, said midrange potential being between said first potential and said second potential.

15. The method as specified in claim 14, further comprising controlling said midrange potential.

16. The method as specified in claim 14, further comprising disabling a logic circuitry to control said midrange potential.

* * * * *